US008682317B2

(12) United States Patent
Pinder

(10) Patent No.: US 8,682,317 B2
(45) Date of Patent: Mar. 25, 2014

(54) SYSTEM AND METHOD FOR COOPERATIVE SCANNING

(75) Inventor: Ellis A. Pinder, Davie, FL (US)

(73) Assignee: Motorola Solutions, Inc., Schaumburg, IL (US)

(*) Notice: Subject to any disclaimer, the term of this patent is extended or adjusted under 35 U.S.C. 154(b) by 471 days.

(21) Appl. No.: 11/537,039

(22) Filed: Sep. 29, 2006

(65) Prior Publication Data
US 2008/0081675 A1 Apr. 3, 2008

(51) Int. Cl.
H04W 4/00 (2009.01)

(52) U.S. Cl.
USPC ........... 455/434; 455/574; 455/41.2; 455/516

(58) Field of Classification Search
USPC ............... 455/454, 455, 41.1, 41.2, 574, 516, 455/517, 518, 519, 436, 552.1
See application file for complete search history.

(56) References Cited

U.S. PATENT DOCUMENTS

| 6,665,521 | B1* | 12/2003 | Gorday et al. | 455/67.11 |
| 6,807,163 | B1* | 10/2004 | Shi | 370/337 |
| 6,810,251 | B2* | 10/2004 | Hassan et al. | 455/434 |
| 6,983,162 | B2* | 1/2006 | Garani et al. | 455/518 |
| 2005/0255877 | A1* | 11/2005 | Fuccello et al. | 455/552.1 |
| 2006/0171332 | A1* | 8/2006 | Barnum | 370/254 |
| 2006/0205433 | A1* | 9/2006 | Sim et al. | 455/552.1 |
| 2008/0045210 | A1* | 2/2008 | Kaaja et al. | 455/434 |

FOREIGN PATENT DOCUMENTS

WO 2008042536 A3 4/2008

OTHER PUBLICATIONS

PCT International Search Report for Application PCT/US07/77075, Dated Sep. 26, 2008—8 Pages.
PCT International Preliminary Report Applicaiton No. PCT/US2007/077075 Dated Apr. 9, 2009—8 Pages.
Office Action mailed on Sep. 12, 2011 in counterpart Canadian Patent Application No. 2663517.
English language translation of Notice of Preliminary Rejection mailed on Dec. 31, 2010 in counterpart Korean Patent Application No. 10-2009-7006493.
English language translation of Final Rejection mailed on Jul. Oct. 31, 2011 in counterpart Korean Patent Application No. 10-2009-7006493.
English language translation of Second Notice of Preliminary Rejection mailed on Jul. 12, 2012 in counterpart Korean Patent Application No. 10-2009-7006493.

* cited by examiner

Primary Examiner — Ping Hsieh
(74) Attorney, Agent, or Firm — Barbara R. Doutre

(57) ABSTRACT

A communication network (100) includes a plurality of communication devices (102, 104) communicating over multiple systems or channels and also communicating over a short range link, such as a personal area Network (PAN) link (106). The plurality of communication devices (102, 104) utilize pre-stored scan lists (156, 166) and cooperative scanning (600). The cooperative scanning involves partitioning the scan lists (156, 166) among the plurality of devices via the short range link to minimize battery consumption or enhance scan performance.

29 Claims, 6 Drawing Sheets

SYSTEM AND METHOD FOR COOPERATIVE SCANNING

FIELD OF THE INVENTION

The present invention relates generally to communication systems and more specifically to efficient scanning operations and power conservation for battery operated devices used in seamless mobility applications.

BACKGROUND

Portable hand-held and mobile vehicular battery operated communication devices operate over a broader range of applications than ever before. The ability to transition from one network or system to another without the user being aware of the transition is typically referred to as seamless mobility. Scan operation, used in such systems, allows monitoring of multiple communication channels, talkgroups and/or resources. Today, devices such as two-way radios, cell phones and the like, often include high end features such as cameras, text messaging, mailbox features and organizers to name a few. These features need to remain operational as the device is transitioned between various systems.

Radio users desire a level of scan performance which is seamless: no audio holes, no missed messages, and no message latency. Such performance is not realizable with a single receiver design, and even a dual receiver design does not guarantee seamless performance in all cases. Furthermore, the use of multiple receivers and faster scanning along with today's high end features all increase battery power consumption which is particularly problematic for the portable device. Scan operation typically prevents or limits standby or "battery save" types of modes, resulting in greater power utilization. Hence, the use of scan operation can necessitate a larger battery or a shorter runtime, again negatively impacting a portable radio.

Accordingly, it would be beneficial to have battery powered communication devices capable of seamlessly transitioning amongst systems without severe degradation of battery life, without impacting or limiting the use of high end features and without impacting the size or weight of the devices.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
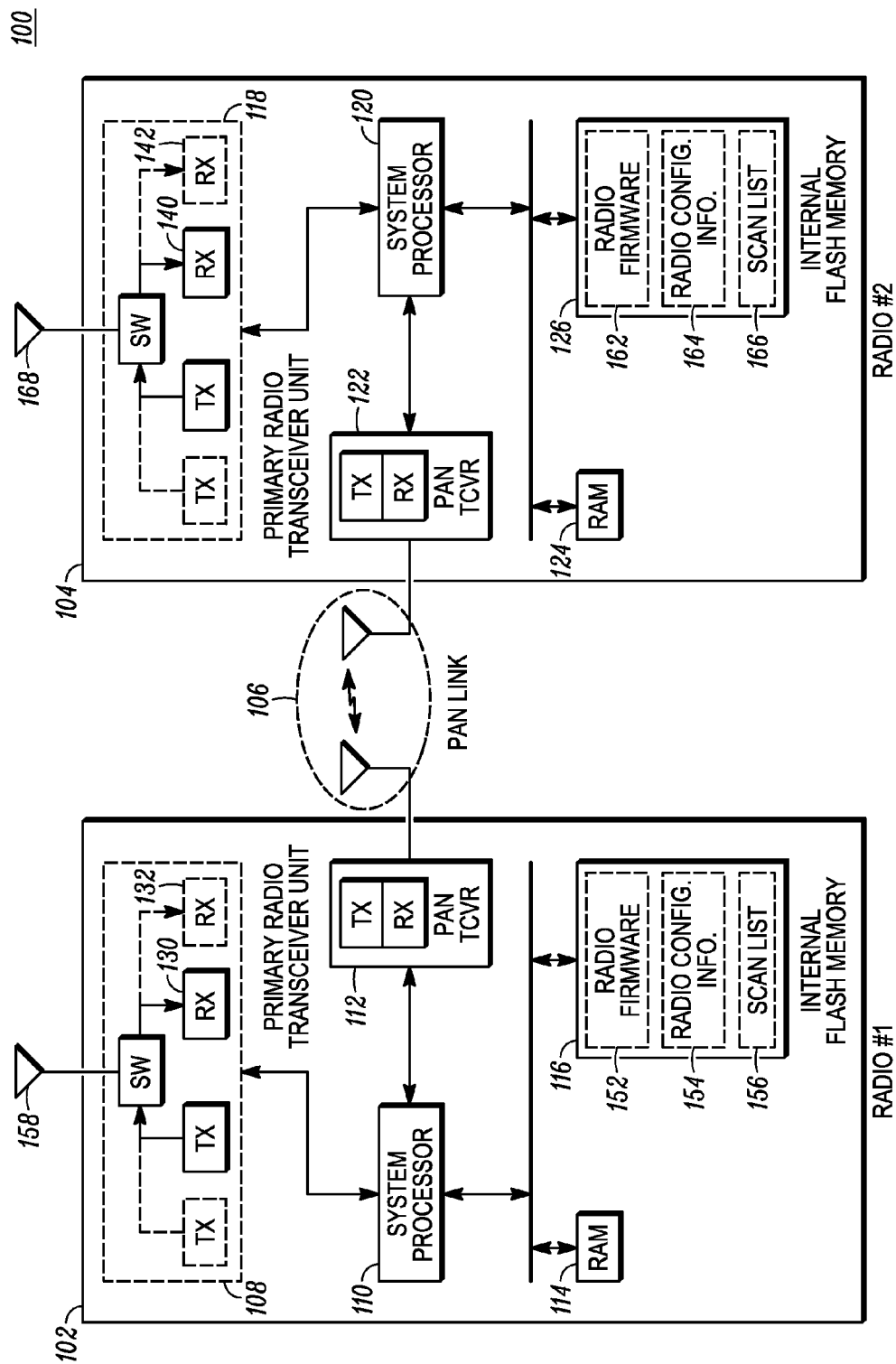
FIG. 1 is a block diagram of a communication network formed in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in apparatus components and methods related to a system and method of cooperative scanning between a plurality of radios. In accordance with the present invention, cooperative scanning provides improved battery performance while scanning or improved scan performance. Accordingly, the components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Briefly, there is provided herein a communication network comprising a plurality of battery powered communication devices, including portable (hand-held) and mobile (in-vehicle) radios operating over multiple systems. A system for the purposes of this application can be a single site trunking system, multi-site trunking system or conventional channel.

The communication system formed in accordance with the present invention focuses on multi-system scan where the radio must change frequency between systems. For multi-system scanning, different talkgroups and/or conventional channels across different systems are scanned. Multi-system scan can thus be differentiated from single system scan, in that single system scan will scan talkgroups within one system only.

FIG. 1 is a block diagram of a communication network 100 formed in accordance with an embodiment of the invention. System 100 includes a plurality of communication devices, here shown as first and second radios 102, 104, at least one of which is a battery powered communication device. For the purposes of this embodiment, radio 102 will be described as a portable (hand-held) radio, and radio 104 will be described as a mobile (vehicular) radio. As will be discussed later, depending on the type improvement sought (battery performance or scan performance), radios 102, 104 may be portable and radios 102, 104 may be mobiles.

Portable radio 102 preferably communicates with mobile radio 104 over an ad hoc network, preferably over a Personal Area Network (PAN) link 106. While the PAN link 106 is preferred, cooperative scanning may also benefit from other short range communication links such as a local area network (LAN). Portable radio 102 includes a transceiver section 108, with at least one receiver 130, shown here as one or more receivers 130, 132 and at least one high power transmitter. A system processor 110 interoperates with transceiver section 108, PAN transceiver 112, Random Access Memory (RAM) 114 and internal flash memory 116. Portable radio 102 communicates with mobile radio 104 over the PAN link 106.

Mobile radio 104 may be similarly configured having a transceiver section 118 having at least one receiver 140, shown here as one or more receivers 140, 142 and at least one high power transmitter. A system processor 120 interoperates with transceiver section 118, PAN transceiver 122, Random Access Memory (RAM) 124 and internal flash memory 126.

In accordance with this embodiment, PAN link 106 is used to share cooperative scanning information between radios, so as to provide a battery save preference or a high performance scan preference of operation. Note that the PAN does not scan. The scanning takes place using receivers 130, 140.

In accordance with this embodiment portable and mobile radios 102, 104 communicate over multiple systems or channels and also communicate over the PAN link 106. The portable and mobile radios 102, 104 utilize pre-stored scan lists 156, 166 and cooperative scanning. The cooperative scanning involves partitioning the scan lists 156, 166 among the plurality of devices via the PAN 106 to minimize battery consumption or enhance scan performance.

Radios 102 and 104 may each be single band or multi-band. A multi-band radio supports a plurality of frequency bands. A radio with multiple receivers can monitor two channels and/or systems simultaneously. A radio may have more than one (or perhaps all) receivers on the same frequency band. Multiple receivers capable of a common frequency band allow excellent scan performance because a channel or system can be continually monitored by one receiver while the second receiver is scanning one or more other channels. For example, a preferred or a "priority" channel or system may be continually monitored by one receiver 130 while the other receiver 132 is used for scan, thus providing the preferred channel or system with no increase in message latency. Thus, for example, radio 104 could have two receivers 140, 142 providing constant monitoring of one channel.

The low-power data transceivers 112 (for radio 102) and 122 (for radio 104) are capable of interoperating in the short range or personal area network (PAN). The PAN transceivers 112, 122 preferably operate in a separate radio band from traditional two-way radio communications used for user voice and data services. The PAN transceivers 112, 122 can include the 802.11 or 802.15.4 type of transceivers and their associated protocols. As mentioned previously, although shown in terms of a PAN application, LAN communications can be used as well.

In accordance with an embodiment of the invention, each radio 102, 104 contains memory 116, 126, preferably an internal flash memory, having radio firmware, 152, 162; radio configuration information 154, 164; and at least one scan list 156, 166 stored therein. The radio firmware 152, 162 includes radio application information. The radio configuration information 154, 164 provides a radio codeplug for storing radio identify information and radio configuration information. The identity information stored in the radio codeplug includes at least one of: a user identification number, a trunking system identification number, a group/company/organization identification number, and authentication information. Each radio 102, 104 is programmed for scan operation via the scan lists 156, 166, with each list comprising a list of channels or systems to be scanned.

The radio firmware 152, 162 of each radio 102, 104 contains authentication software that allows a given radio in the communication system 100 to detect and authenticate another radio which comes into range of its personal area network. Radios from other organizations intended for use in other communication systems can be detected but will not be authenticated, thereby denying one radio access to another radio over the PAN link 106. Proximate radios of the same organization detect and authenticate, allowing the radios to transmit, receive, and share information with each other over the PAN link 106.

In an embodiment of the invention, a first portable radio 102 assigned to a user comes within PAN range 106 of a mobile radio 104 in the user's vehicle. The first radio 102 and the second radio 104 authenticate each other, and then share scan list information 156, 166, as well as frequency band support information and individual IDs and/or organizational codes preferably stored in the radio configuration information 154, 164. If the band support of the mobile radio 104 is equal to or exceeds that of the portable 102, then the scan list 156 of the portable is sent to the mobile 104, and the mobile 104 creates a cooperative scan list from the combined lists 156, 166. The cooperative scan list can be stored in RAM 124, or alternatively in flash memory 126. The combined list might be identical to a list in one or both of the radios 102, 104. The mobile radio 104 then executes scan operation on behalf of the portable radio 102, and sends the portable periodic updates over the low-power PAN link 106. This transmission allows the battery-powered portable 102 to spend a substantial amount of time in a reduced power-consumption (sleep) mode, while the vehicle-powered mobile radio 104 performs the scan on its behalf. Since the external antenna 168 is likely of higher gain than the portable radio antenna 158, scanning by the mobile on behalf of the portable also provides improved receive performance.

Communication system 100 also provides for operational scan preferences to be set in each radio which determine the type, extent and the configuration of cooperative scanning. These preferences are preferably stored in the radio configuration information 154, 164, and may or may not be accessible to the radio user. One such configuration parameter is the cooperative scan type, which, in accordance with the invention, can be set to "battery save" or "high performance." The battery save preference enables the mobile radio 104 to scan on the portable radio's 102 behalf and is indicative of the "battery save" cooperative scan type. The high performance scan preference enables scanning based on the distribution of a plurality of individual scan lists to a plurality of radios, with the distribution optimized to improve scan performance.

For the "high performance" embodiment, the portable radio 102 does not enter a battery save mode, but instead scans cooperatively, and simultaneously, with the mobile radio 104 to provide improved scan performance. Upon co-location of the portable radio 102 with the mobile radio 104, the radios authenticate themselves and share scan list information, frequency band support information, and individual IDs, and/or organizational codes. The radios 102, 104 then create a cooperative scan list and partition the scan list between the two radios, creating cooperative scan sub-lists as will be described later. Cooperative scan sub-lists provide the benefit of reduced message latency.

Communication system 100 of the present invention also allows for the automatic activation of scan. If a mobile radio 104 currently has scan operation set to "off" and the portable radio 102 currently has scan operation set to "on", then upon co-location of the two radios via the PAN 106, the mobile radio will automatically activate scan if it determines that at least a portion of the portable's list is scannable. When the portable radio 102 moves out of PAN range for some period of time, then the mobile radio will discontinue scan operation if its previous state was off. If the mobile radio determines that the portable radio's scan list is not scannable (due to lack of frequency band support), then the mobile radio does not activate its scan mode.

Upon detection of received activity, the radio behaves according to the preferences setting in the configuration data. In one embodiment, the mobile radio always unmutes. This is true even if the radios were performing cooperative scanning in "high performance" mode. If the portable radio 102 detects qualified channel activity in its cooperative scan list partition, then it notifies the mobile radio 104 over the PAN link 106 and the mobile 104, if RF-capable, would unmute to that channel. If the mobile radio 104 is not RF capable for that channel or system, then the portable radio 102 unmutes, or alternately, the received audio can be sent over the PAN link 106 to the mobile radio 104 to be played on the mobile radio's speaker. In fact, the portable radio 102 likely consumes less battery power to transmit received audio to the mobile radio 104 than to activate its own audio power amplifier.

Another alternate embodiment also provides for a user ID proxy capability. This embodiment allows a radio to monitor for individually-targeted communications for all radio IDs currently participating in the cooperative scanning. If the radio allows a user to login or register on a radio on one or more communication networks, then that user has a user ID that is common to multiple radios. Some radios and communication systems use individual radio IDs, so a user of a portable 102 and mobile radio 104 may have two separate IDs. For this embodiment, the portable and mobile radios have different radio IDs, and the mobile radio 104 monitors for its own ID as well as for portable radio's 102 ID. The ID proxy embodiment provides the advantage of ensuring individually targeted communications are not missed if a radio is in sleep mode. For example, if the mobile radio 104 has an ID of "111", and the portable radio 102 has an ID of "222", and the portable is in sleep mode, and the mobile is scanning for the portable—the following will occur upon an incoming call. When a call comes in to the mobile radio 104 using ID "222", the mobile alerts the portable 102 or handles the proxied ID as its own. If cooperative scan is not active, then the mobile 104 ignores the ID "222". Thus, the ID proxy embodiment provides battery savings on the portable side. The ID proxy can also be used in high performance scan applications as well.

FIGS. 2, 3, 4 and 5 provide examples of scan lists and examples of partitioning of these scan lists into sub-lists to achieve improved battery life or improved scan performance. The portable radio 102 derives the benefit of battery savings if the mobile radio 104 scans on the portable's behalf. Battery savings can also be obtained in a portable/portable embodiment where radios 102 and 104 are both portables, and one scans on behalf of the other. Improved scan performance can be obtained in any combination of radios: portable/mobile, portable/potable or mobile/mobile. As was discussed in FIG. 1, the radio configuration information 154, 164 preferably stores the type of desired performance operation: improved battery performance or improved scan performance.

Figure 2:
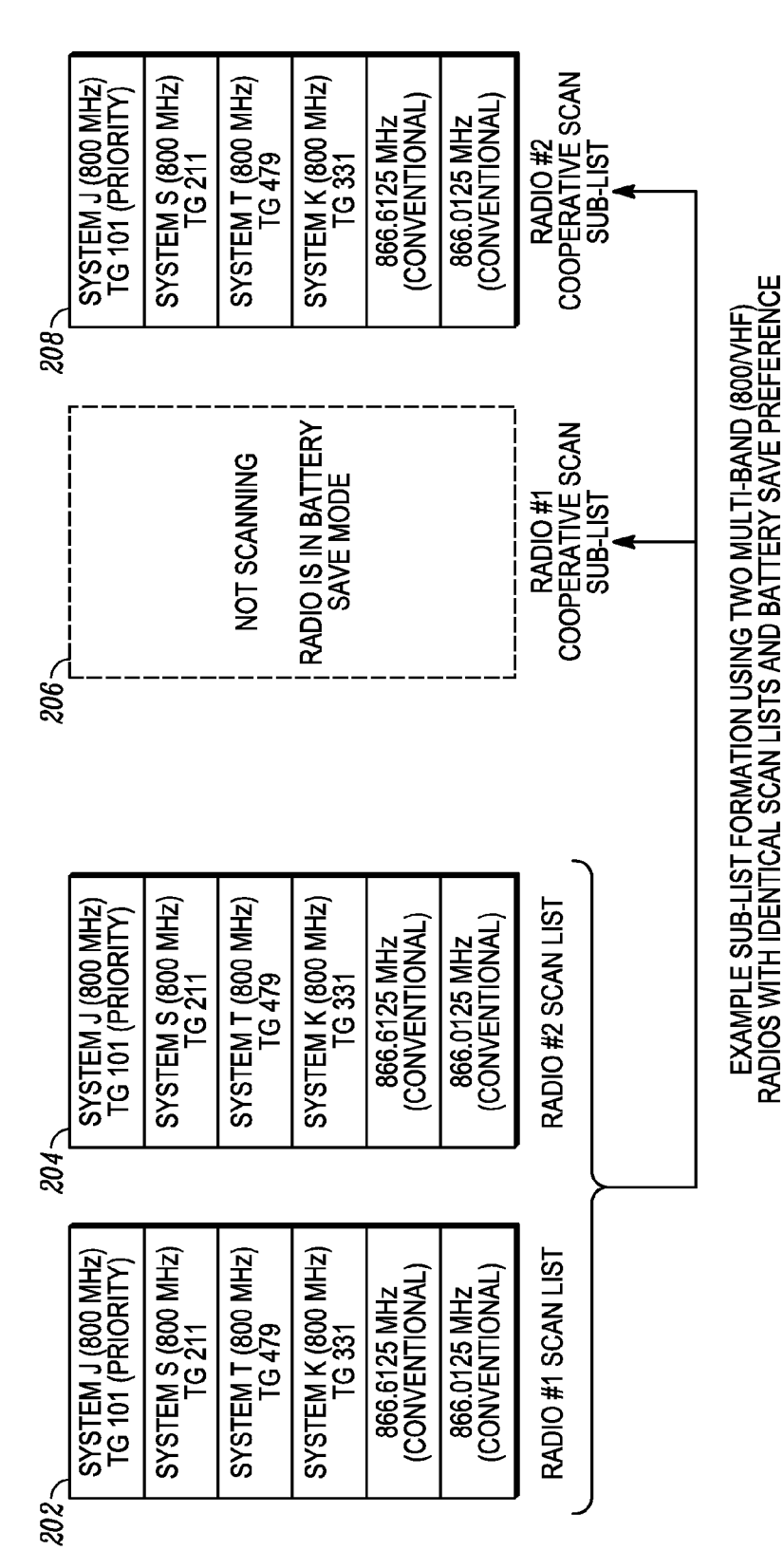
FIG. 2 is an example of a formation of cooperative scan sub-lists with identical scan lists and battery save preference according to some embodiments of the invention.

Referring to FIG. 2, there is shown an example of a formation of cooperative scan sub-lists 200 according to an embodiment of the invention. In this example, first and second multi-band (800 MHz band and VHF band) radios (radio #1, radio #2), such as portable radio 102 and mobile radio 104 of FIG. 1, have identical scan lists 202, 204 and operate according to a battery save preference. The battery save preference is preferably stored as part of the radio configuration information 154, 164, or may alternatively be a selectable parameter. The formation of sub-lists 206, 208 is based on the battery save preference in order to provide cooperative scanning that conserves battery life. In this example, sub-list 206 for portable radio 102 (radio #1) is empty because the portable radio is not sharing the scan task with the mobile radio 104. The mobile radio 104 is "cooperating" by saving battery power from being drained from the portable radio 102. In this embodiment, the mobile performs scan on behalf of the portable (portable in sleep mode) to conserve battery life.

Figure 3:
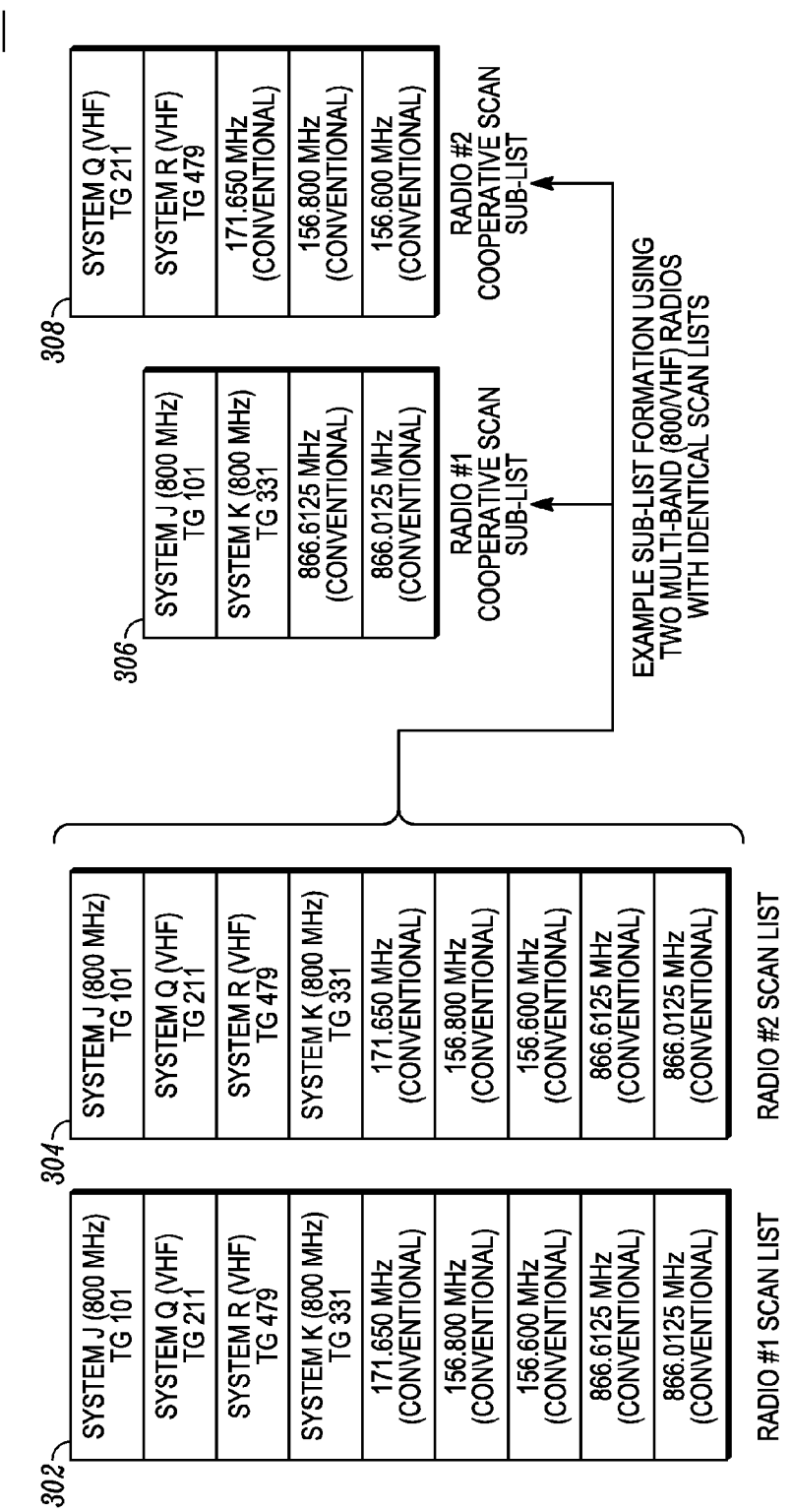
FIG. 3 is an example of a formation of cooperative scan sub-lists using two multi-band radios with identical scan lists in accordance with some embodiments of the invention.

FIG. 3 is an example of sub-list formation 300 using two multi-band (800 MHz band and VHF band) radios with identical scan lists. As shown, if the two radios have identical scan lists 302, 304 then the sub-lists 306, 308 can be a mere partitioning of the list. In this case, radio #1's cooperative scan sub-list provides 800 MHz scanning operation, while radio #2's cooperative scan list provides VHF scanning operation. Note that these sub-lists 306, 308 could also have been interchanged with radio #1 scanning within the VHF band, while radio #2 scans within the 800 MHz band. Thus, one radio is used for one band while the second radio is used for another band. The partitioning is based on the minimization of scan latency.

As another example (not shown) for the embodiment for FIG. 3, all the channels could be 800 MHz band channels (without VHF) and the partitioning could split the 800 MHz channels between the two radios 102, 104. However, if in FIG. 3, radio #1 covers 800 MHz and radio #2 covers both 800 MHz and VHF, then the scan lists can not be swapped. Thus, radios having different RF capabilities can constrain the order as to how the RF sub-lists are partitioned.

Figure 4:
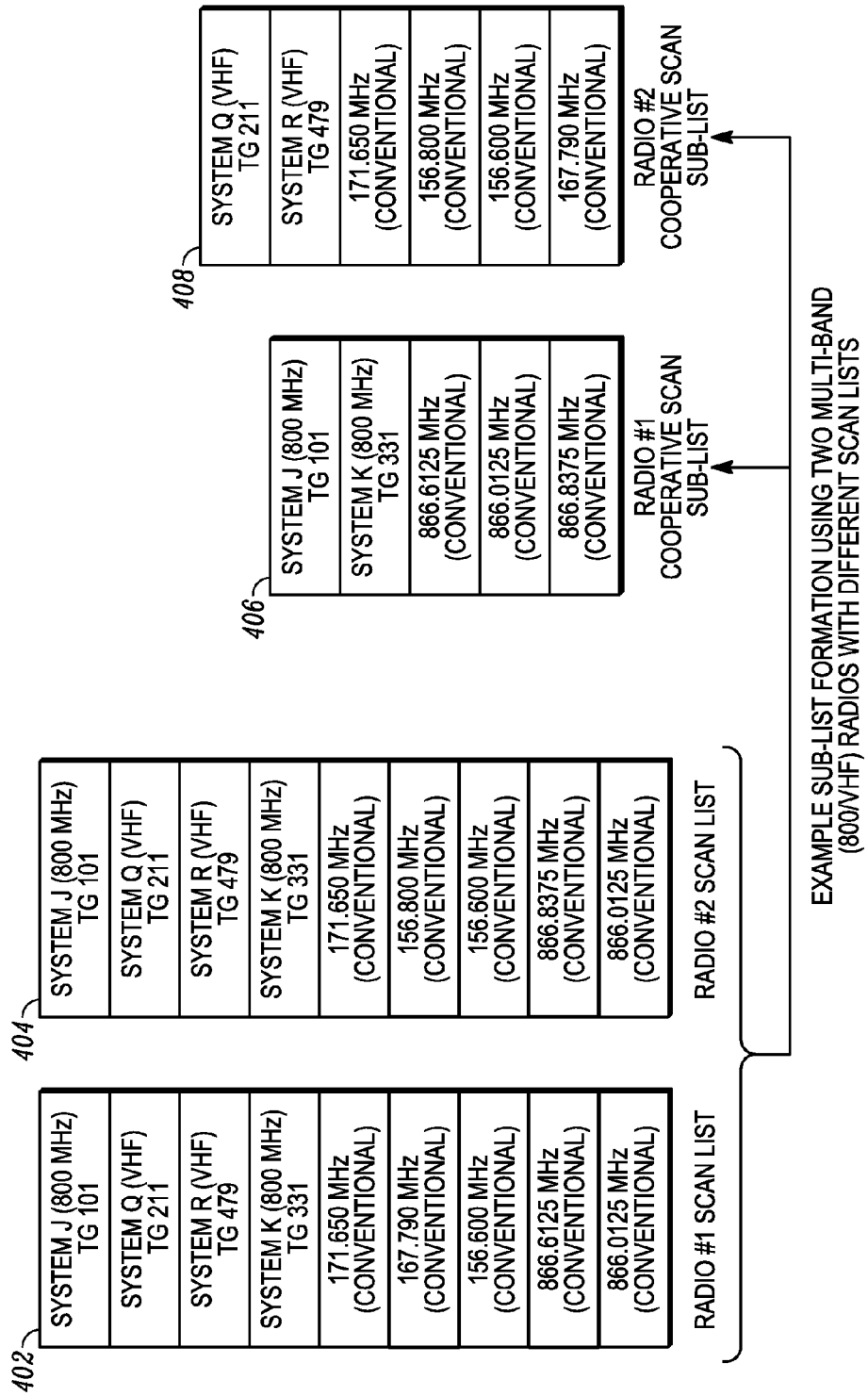
FIG. 4 is an example of a formation of cooperative scan sub-lists using two multi-band radios with different scan lists and performance preference in accordance with some embodiments of the invention.

FIG. 4 is an example of sub-list formation 400 using two multi-band (800 MHz band and VHF band) radios with different scan lists and a high performance scan preference. As seen, scan list 402 for radio #1 (portable radio 102) is different from scan list 404 for radio #2 (mobile radio 104). Thus, if the two radios 102, 104 have different scan lists 402, 404 and identical RF hardware, then the sub-lists 406, 408 are a partitioning of a superset of the radios' scan lists. The superset is the union of the two sub-lists 402, 404. Because of the identical hardware (i.e. both radios can communicate over VHF and 800 MHz), the partitioned lists 406 and 408 can also be reversed/swapped.

Still referring to FIG. 4, as another example, if the two radios 102, 104 (radio #1 and radio #2) have different scan lists and different RF hardware, then the sub-lists are a partitioning of the superset of the radios' scan lists taking into consideration each radio's ability to synthesize frequencies associated with list members. Because of the different RF hardware, however, the sub-lists 406, 408 will be constrained to a certain arrangement between radios #1, #2, based on RF capability.

Figure 5:
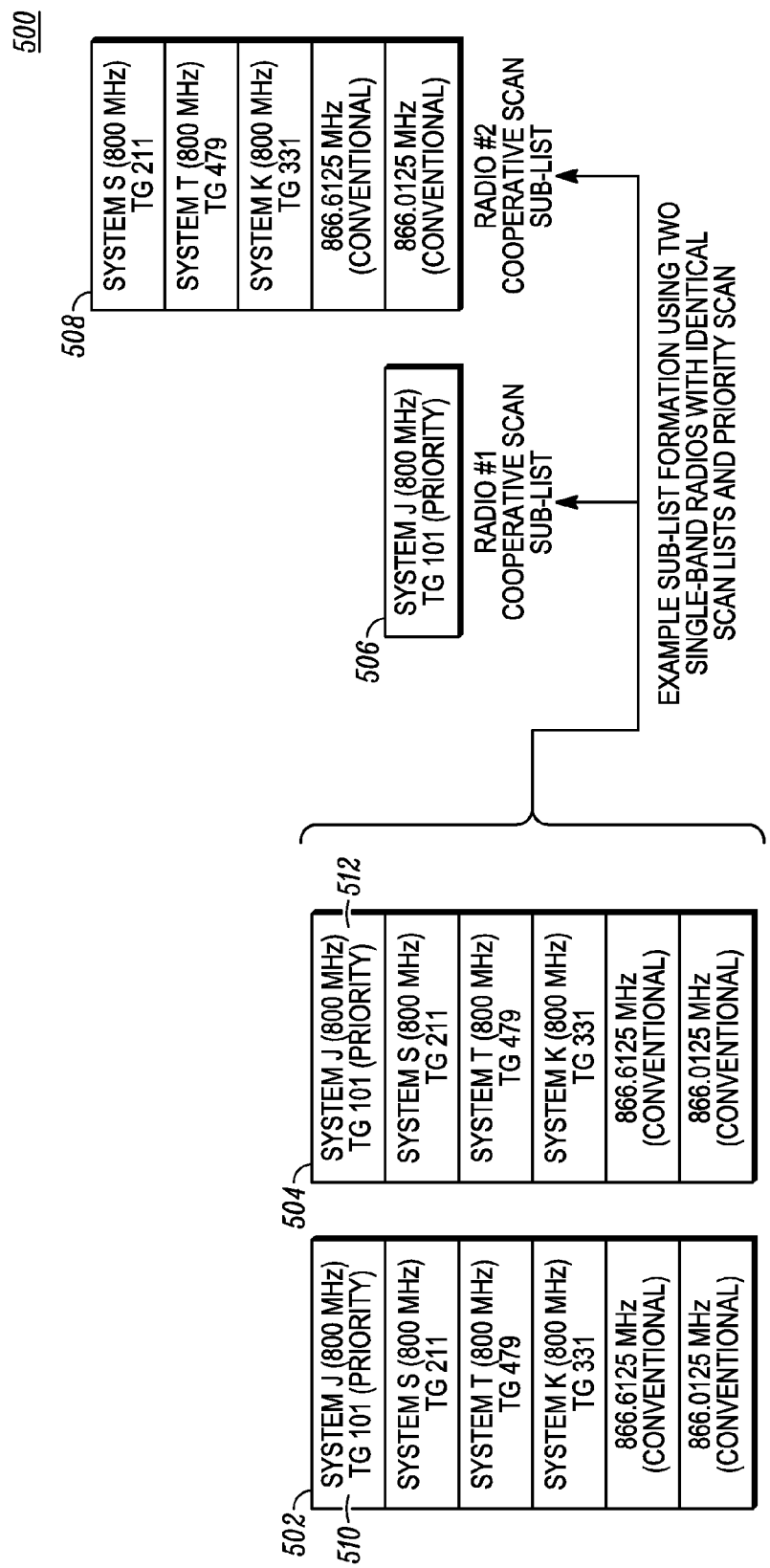
FIG. 5 is an example of a formation of cooperative scan sub-lists using two single-band radios with identical scan lists and priority scan in accordance with some embodiments of the invention.

Moving to FIG. 5, if the radios (radio #1, radio #2) have the same RF capabilities and priority scan is used, then sub-list generation preferably assigns special consideration to the priority channel. FIG. 5 shows sub-list formation 500 using two single-band radios (800 MHz band) with identical scan lists 502, 504, with high performance preference with priority scan 510, 512. The scan lists are combined and partitioned into sub-lists 506, 508 with one sub-list containing only the priority channel thereby providing constant monitoring of the priority channel. As shown in FIG. 5, a single priority channel 506 is the only member of radio #1's sub-list, which provides ideal scan performance (zero latency) for the priority channel. If a "priority 2" channel is designated, this can be scanned by radio #2 multiple times through list traversal or it can be scanned by radio #1 but less frequently than the priority channel. Since the priority radio (radio #1) is performing constant monitoring, audio holes are avoided. While shown in a single-band application, the priority scan embodiment applies to multi-band embodiments as well. The priority embodiment thus allows one radio to be assigned to monitor the priority channel constantly.

In accordance with the various embodiments described above, the cooperative scanning of the present invention provides a means to partition the scan list based on:

Radio RF Capabilities—
A radio can only scan a frequency that is supported by its RF hardware.

Scan Performance Factor—
A radio model may have a scan performance rating to allow optimal load balancing between radios with intrinsically different scan performance.

Signal Strength—
A portable radio, especially one in a vehicle, may be at a disadvantage for detecting RF signals. Trunking systems with continuous control channel data are easily monitored, and a determination can be made as to whether this can be reliably scanned by the portable. Trunking systems with weaker signals, and conventional channels which may not be immediately characterizable, may be better choices for scanning by the mobile radio. Thus the signal strength and radio type (mobile vs. portable) may be used in the process of partitioning the scan lists.

Priority—
A channel designated as a priority channel may be scanned more frequently. A priority channel can be placed in its own sublist to allow for constant monitoring. Alternately, a priority channel can be provisioned in the sub-lists of both cooperative scanning radios and its scan position in the list can be adjusted periodically to minimize the latency of traffic on the priority channel.

The cooperative scanning provided in accordance with the various embodiments of the invention is easily extended to support more than two radios, and to support radios with multiple receivers. In addition, the examples have described one portable radio and one mobile radio, but the cooperative scanning provided by the present invention does not necessarily require one portable and one mobile radio. The portable/mobile embodiment and portable/portable embodiment can greatly benefit from battery save preference, and the portable/mobile or portable/portable or mobile/mobile embodiments can all benefit from improved scan performance.

Figure 6:
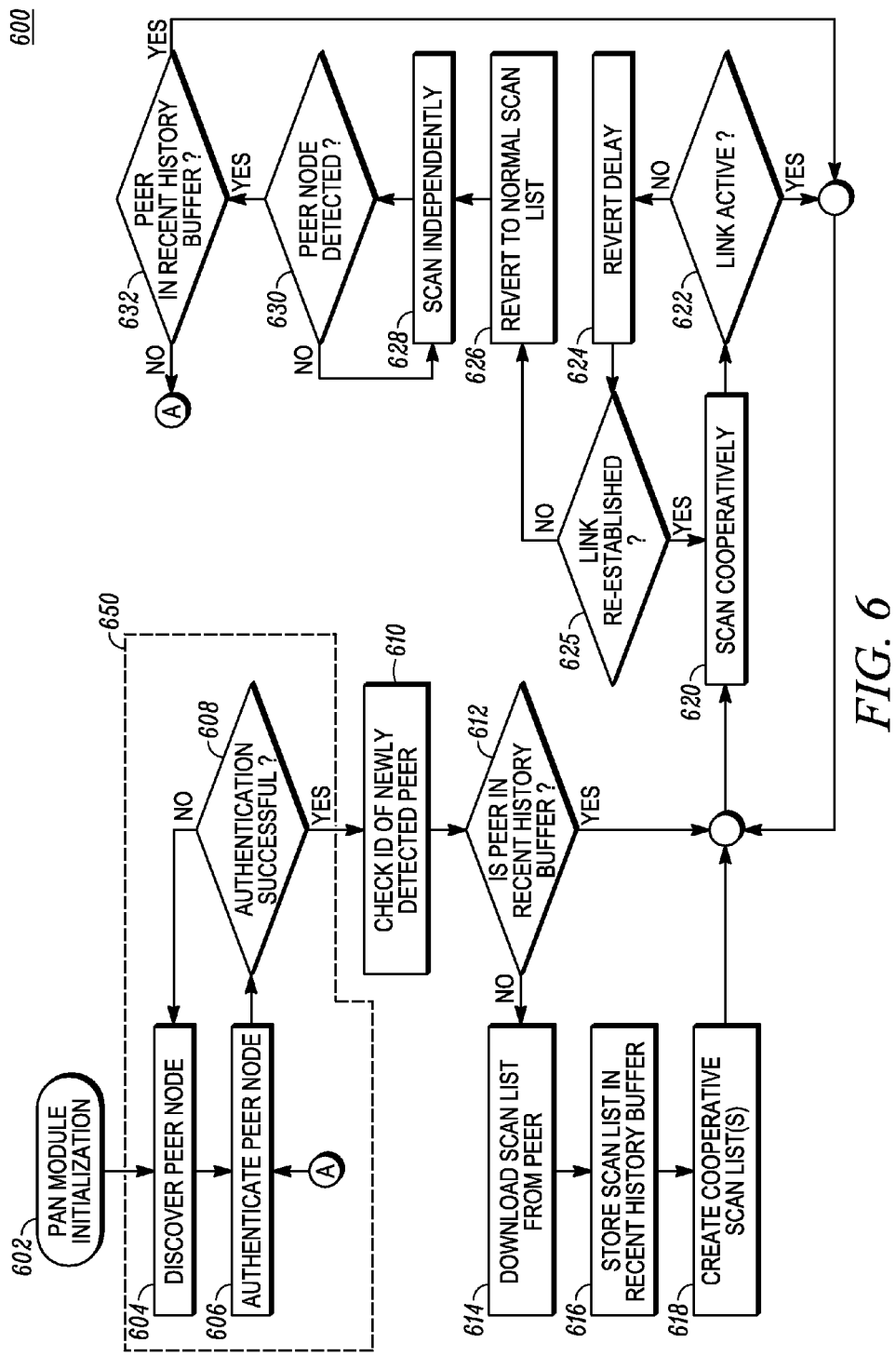
FIG. 6 is a method of two devices cooperatively scanning in accordance with some embodiments of the invention.

Referring to FIG. 6, there is shown a method 600 for two radios, such a portable radio 102 and mobile radio 104, to interoperate on an ad-hoc network, such as PAN or wireless LAN, to achieve cooperative scanning. The steps provided by method 600 are preferably stored in the radio firmware 152, 162 within memory 116, 126 of radios 102, 104 of FIG. 1. Method 600 provides for detection and undetection of nodes via PAN by performing the following steps. PAN module initialization occurs at 602 (radios 102, 104). Discovery of a peer node (122 of radio 104) is performed at 604 followed by the authentication of the peer node at 606. If authentication is not successful at 608, then the radio (102) returns to 604 and continues discovery. The steps of discovering 604 and authenticating 606, 608 are grouped by designator 650 and can be generally referred to as association steps. Other association steps can also be used.

If authentication is deemed successful at 608, then the radio (102) will check the ID of a newly detected peer node (104) at 610. At 612, a check is made to determine if the peer node (104) is in a recent history buffer. If the peer node is new (i.e. a "no" at 612), then the radio (102) queries the peer (104) for capabilities and downloads a scan list at 614 of the radio (104). The downloaded scan list is stored in a recent history buffer at 616 (buffer of 102). The capabilities of the two radios (102, 104) are compared, and using criteria disclosed above, cooperative scan lists are created at 618. The radio (102) sends the cooperative scan list to the peer (104). Cooperative scanning then begins at 620 (102 and 104).

If the peer (104) was already known to the radio (102), then the step of checking ID of newly detected peer at 610 and determining if the peer node is in a recent history buffer at 612 would result in a "yes" bypassing the need for setup steps 614, 616 and 618 and instead quickly initiating cooperative scan at 620. The step of checking ID at 610 may be performed by checking an identifier that indicates the radio such as a Radio ID, MAC address, etc. Alternatively, the ID could represent a hash of a scan list. The hash approach has the additional advantage of allowing two radios to quickly determine if they have identical scan lists. This scenario is more likely to occur in trunking systems, where individual users are often not permitted to modify their lists. If a radio supports multiple bands, there may be a separate scan list for each band. A portable 800 MHz radio may have one or more 800 MHz scan lists, and a dual band mobile (VHF, 800 MHz) may have one or more 800 lists and one or more VHF lists. By simply comparing hashes at 610, which ideally are pre-computed, the portable radio can quickly determine that its list matches one of the mobile's lists.

Continuing with the method of FIG. 6, if the link (between 102 and 104) is lost or fades while scanning cooperatively as determined at 622, then it may be desirable to only initiate the cooperative scanning if the PAN signal strength is characterized as good for some period of time. Thus, while scanning at 620, if the signal is lost at 622, a revert delay step is applied at 624. If the link is detected at 622, then cooperative scanning continues at 620; if not, then the radio applies a revert delay at 624 to allow time for the link to be re-established. If the link is re-established, as determined at 625, then cooperative scan returns at 620. If the link is not re-established after the delay, then scanning reverts to the normal scan list at 626 for independent scanning at 628. The normal scan lists used in independent scan are, for example, those discussed previously as scan lists 202, 204, 302, 304, 402, 404, 502, 504.

The revert delay at 624 may be, for example, a codeplug parameter. The codeplug parameter may be influenced by one or more of: whether the radio is performing priority scan; the type of cooperative scanning (battery save vs. performance); and the scan list relationship.

While scanning independently at 628, discovery continues for peer nodes at 630. Peer nodes detected at 630 are compared against a recent history buffer at 632, with new nodes being authenticated at 606, and known nodes being fast-tracked back into cooperative scan at 620.

While described in terms of a battery powered communication device, the mobile radio 104 may also take the form of a wall-powered desk radio or consolette. Thus, a portable radio coming within range of one of these devices can benefit from the battery savings and scan performance improvement provided by the cooperative scanning in accordance with the various embodiments of the invention.

The cooperative scanning provided in accordance with the various embodiments of the invention can be incorporated within single and multi-band radios. Today, radio designs generally utilize two receivers to handle two bands. As radio designs continue to improve, this will not be the case. One receiver may handle two, three, or even four bands. The receiver, however, can monitor just one band at a time. As radio technology expands, a two-receiver mobile radio where each receiver can operate independently and each one receiver can work over all of VHF, UHF, 800, etc. is perfectly feasible. The benefits of battery savings and scan performance improvement, previously unrealizable in single and even dual receiver designs, can now be achieved via the use of cooperative scanning between radios.

The cooperative scanning provided in accordance with the various embodiments of the invention is also useful in mission-critical communication device applications, particularly the embodiment requiring authentication of discovered radios via the PAN. Since discovery of network nodes in an ad hoc network is well-known, and publishing of available services available by a node is well-known, the cooperative scanning technique of the present invention is easily implemented into existing systems. Such techniques are preferably applied to the preferred embodiment. For example, upon discovery of a node, a radio will authenticate the node. The radio can quickly determine the services available by the node using well-known techniques, and can make further inquiries to obtain more specific information.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A communication network, comprising:
a plurality of communication devices communicating over multiple communication systems, at least one of the communication devices being a battery powered communication device having a high power transceiver and a low power transceiver, wherein the high power transceiver and the low power transceiver operate in different frequency bands, the high-power transceiver having a transmitter and receiver being used for two-way radio communication, and the receiver of the high power transceiver also being used to scan, and the low power transceiver sharing pre-stored scan lists amongst the plurality of communication devices, wherein the pre-stored scan lists comprise a list of frequency channels to be scanned; and
the plurality of communication devices utilizing cooperative scanning between at least two of the plurality of communication devices to enable one of: a battery save preference or a high performance scan preference, wherein the cooperative scanning combines the pre-stored scan lists within the at least two of the plurality of communication devices into a combined scan list and further partitions the combined scan list into at least two individual sub-lists in accordance with the enabled preference.

2. The communication network of claim 1, wherein the battery save preference is achieved by a mobile radio scanning on behalf of a portable radio.

3. The communication network of claim 1, wherein the battery save preference is achieved by a portable radio scanning on behalf of another portable radio.

4. The communication network of claim 1, wherein the high performance scan preference enables scanning based on a distribution of a plurality of individual scan lists to the plurality of communication devices, with the distribution optimized to improve scan performance.

5. The communication network of claim 1, wherein cooperative scanning is achieved upon co-location of two of the plurality of communication devices, the two devices authenticating themselves and sharing scan list information, frequency band support information, and individual IDs, and organizational codes.

6. The communication network of claim 1, wherein the high performance scan preference is achieved based on simultaneous scanning between the battery powered communication device and one of: a mobile radio, a wall powered radio, and a portable radio.

7. The communication network of claim 6, wherein the battery powered communication device is another mobile radio or another portable radio.

8. The communication network of claim 1, wherein individual sub-lists are formed by a partitioning of the combined scan list taking into consideration ability of each of the plurality of communication devices to synthesize frequencies associated with the pre-stored scan lists.

9. The communication network of claim 1, wherein the individual sub-lists are formed based on two single-band radios with identical scan lists, priority scan and performance preference.

10. The communication network of claim 1, wherein the plurality of communication devices comprise a battery powered portable (hand-held) radio and a battery powered mobile (vehicular) radio.

11. The communication network of claim 1, wherein the plurality of communication devices comprise a battery powered portable (hand-held) radio and a wall powered desk radio or consolette.

12. The communication network of claim 1, wherein the plurality of communication devices comprise first and second battery powered (hand-held) portable radios.

13. The communication network of claim 1, wherein the plurality of communication devices comprise first and second mobile (vehicular) radios.

14. The communication network of claim 1, wherein the multiple communication systems comprise at least two of: single-site trunking system, multi-site trunking system or conventional channel system.

15. The communication network of claim 1, wherein the plurality of communication devices change frequency between multiple communication systems during the cooperative scanning among the multiple communication systems.

16. The communication network of claim 15, wherein the cooperative scanning occurs between multiple talk groups and/or conventional channels across the multiple communication systems.

17. The communication network of claim 1, wherein the battery save preference and the high performance scan preference are selectable parameters.

18. The communication network of claim 1, wherein when the battery save preference is the enabled, one of the at least two of the plurality of communication devices scans a list of frequency channels included in the corresponding individual sub-list on behalf of other of the plurality of communication device, and further wherein the individual sub-list of the other of the at least two of the plurality of communication devices is empty.

19. The communication network of claim 18, wherein when the high performance scan preference is enabled, the at least two of the plurality of communication devices scan the list of frequency channels included in the respective individual sub-lists simultaneously.

20. A communication system, comprising:
- a plurality of battery operated radios operable over an ad hoc network, the plurality of battery operated radios including at least one portable radio and one mobile radio;
- at least one high power transceiver and at least one low power transceiver in each of the least one portable radio and at least one mobile radio, wherein the at least one high power transceiver and the at least one low power transceiver operate in different frequency bands;
- scan lists stored within the plurality of battery operated radios, wherein the scan lists comprise a list of frequency channels to be scanned; and
- at least two of the plurality of battery operated radios utilizing cooperative scanning in which the scan lists are combined to form a combined scan list and the combined scan list is partitioned into individual sub-lists according to predetermined operating preferences, wherein the at least one high-power transceiver operates two-way radio communication and performs scanning, and the at least one low-power transceiver shares the scan lists amongst the plurality of battery operated radios.

21. The communication system of claim 20, wherein the cooperative scanning partitions the scan lists based on at least one of: radio frequency (RF) capabilities, scan performance factor, and signal strength.

22. The communication system of claim 21, wherein partitioning based on signal strength determines whether scanning should be performed by the portable radio or the mobile radio.

23. The communication system of claim 20, wherein partitioning is based on priority.

24. The communication system of claim 23, wherein partitioning based on priority allows a channel designated as a priority channel to be scanned more frequently.

25. The communication system of claim 24, wherein the priority is adjusted periodically within the sub-list to minimize latency of traffic on the priority channel.

26. The communication system of claim 20, wherein partitioning is based on a scan performance preference and is enabled by optimal load balancing of scan lists between the portable and mobile radios with intrinsically different scan performance.

27. A personal area network (PAN), comprising:
- first and second radios communicating over a PAN link;
- each radio having a primary transceiver and a PAN transceiver, the primary transceiver being a high power transceiver having a high power transmitter and a receiver, the high power transceiver providing two-way radio communication and the receiver further providing scan and gathering cooperative scanning information, and the PAN transceiver being a low power transceiver used to share cooperative scanning information, wherein the high power transceiver and the PAN transceiver operate in different frequency bands;
- each radio having a memory within which is stored respective radio application information, radio configuration information, and scan list information, wherein the scan list information includes a list of frequency channels to be scanned; and
- the first and second radios utilizing the application information, radio configuration information and scan list information to cooperatively scan, using the first and second radios primary transceiver's receiver, between the first and second radios over multiple systems by combining the list of frequency channels from the first and the second radios to form a combined list of frequency channels and further by partitioning the combined list of frequency channels into individual sub-lists to enable selectable: optimized battery conservation and radio scan performance.

28. The personal area network of claim 27, wherein the first radio is a vehicle powered mobile radio, and the second radio is a battery-powered portable radio, the vehicle powered mobile radio performing cooperative scan from the combined list of frequency channels while battery powered portable radio remains in a reduced power-consumption mode.

29. The personal area network of claim 27, wherein when the optimized battery conservation is selectably enabled one of the individual sub-lists is empty.

* * * * *

UNITED STATES PATENT AND TRADEMARK OFFICE
CERTIFICATE OF CORRECTION

| | | |
|---|---|---|
| PATENT NO. | : 8,682,317 B2 | Page 1 of 1 |
| APPLICATION NO. | : 11/537039 | |
| DATED | : March 25, 2014 | |
| INVENTOR(S) | : Ellis A. Pinder | |

It is certified that error appears in the above-identified patent and that said Letters Patent is hereby corrected as shown below:

On the title page item 56, under "OTHER PUBLICATIONS," in Column 2, Line 3, delete "Applicaiton" and insert -- Application --, therefor.

In the claims

In Column 11, Line 2, in Claim 18, delete "is the enabled," and insert -- is enabled, --, therefor.

Signed and Sealed this
Fifth Day of April, 2016

Michelle K. Lee
*Director of the United States Patent and Trademark Office*